(12) United States Patent
Saenger et al.

(10) Patent No.: US 9,678,432 B2
(45) Date of Patent: Jun. 13, 2017

(54) OPTICAL ASSEMBLY FOR INCREASING THE ETENDUE

(71) Applicant: Carl Zeiss SMT GmbH, Oberkochen (DE)

(72) Inventors: Ingo Saenger, Heidenheim (DE); Christoph Hennerkes, Huettlingen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 14/828,603

(22) Filed: Aug. 18, 2015

(65) Prior Publication Data

US 2015/0355552 A1 Dec. 10, 2015

Related U.S. Application Data

(63) Continuation of application No. PCT/EP2014/054047, filed on Mar. 3, 2014.

(Continued)

(30) Foreign Application Priority Data

Mar. 14, 2013 (DE) .................... 10 2013 204 443

(51) Int. Cl.
*G03F 7/20* (2006.01)
*G21K 1/06* (2006.01)
*G21K 1/12* (2006.01)

(52) U.S. Cl.
CPC ...... *G03F 7/70033* (2013.01); *G03F 7/70075* (2013.01); *G03F 7/70116* (2013.01);
(Continued)

(58) Field of Classification Search
CPC ............ G03F 7/70033; G03F 7/70075; G03F 7/70116; G03F 7/70191; G21K 1/065; G21K 1/067; G21K 1/12
See application file for complete search history.

(56) References Cited

U.S. PATENT DOCUMENTS

| 6,198,793 B1 | 3/2001 | Schultz et al. |
| 6,243,206 B1 | 6/2001 | Wangler |

(Continued)

FOREIGN PATENT DOCUMENTS

| DE | 198 55 106 A1 | 5/2000 |
| DE | 10 2009 025 655 A1 | 3/2010 |

(Continued)

OTHER PUBLICATIONS

German Office Action, with translation thereof, for corresponding DE Appl No. 10 2013 204 443.7, dated Sep. 20, 2013.

(Continued)

*Primary Examiner* — Jack Berman
(74) *Attorney, Agent, or Firm* — Fish & Richardson P.C.

(57) ABSTRACT

An optical system has a light source having an original etendue of less than 0.1 mm² for an illumination system for projection lithography. An optical assembly serves for simultaneously increasing the etendue of a used emission of the light source. The optical assembly is embodied such that an increase in the etendue by at least a factor of 10 results. A component of the optical assembly that is impinged on is displaced relative to the light source such that an impingement region of the emission of the light source on the optical component of the optical assembly varies temporally.

20 Claims, 6 Drawing Sheets

Related U.S. Application Data

(60) Provisional application No. 61/781,759, filed on Mar. 14, 2013.

(52) U.S. Cl.
CPC ......... *G03F 7/70191* (2013.01); *G21K 1/065* (2013.01); *G21K 1/067* (2013.01); *G21K 1/12* (2013.01)

(56) References Cited

U.S. PATENT DOCUMENTS

| | | | |
|---|---|---|---|
| 6,498,351 B1 | 12/2002 | Kruizinga et al. | |
| 6,573,978 B1 | 6/2003 | McGuire | |
| 6,700,952 B2 | 3/2004 | Dinger | |
| 7,259,827 B2 * | 8/2007 | Dierichs | G03F 7/70083 355/30 |
| 2003/0002022 A1 * | 1/2003 | Schultz | G02B 17/0621 355/67 |
| 2004/0140440 A1 | 7/2004 | Schultz et al. | |
| 2005/0264827 A1 | 12/2005 | Schriever et al. | |
| 2006/0132747 A1 | 6/2006 | Singer et al. | |
| 2011/0014799 A1 * | 1/2011 | Dinger | G03F 7/70008 438/795 |
| 2011/0177463 A1 | 7/2011 | Layh et al. | |

FOREIGN PATENT DOCUMENTS

| | | |
|---|---|---|
| DE | 10 2009 047 316 A1 | 12/2010 |
| EP | 062667 A1 | 12/1994 |
| EP | 1072957 A2 | 1/2001 |
| EP | 1614008 B1 | 1/2006 |

OTHER PUBLICATIONS

International Search Report Corresponding to International Application No. PCT/EP2014/054047, dated Jul. 28, 2014.

Chinese Office Action and Search Report, with translation thereof, for corresponding CN Appl No. 201480014883X, dated Oct. 9, 2016.

* cited by examiner

OPTICAL ASSEMBLY FOR INCREASING THE ETENDUE

CROSS-REFERENCE TO RELATED APPLICATIONS

The present application is a continuation of, and claims benefit under 35 USC 120 to, international application of PCT/EP2014/054047, filed Mar. 3, 2014, which claims benefit under 35 USC 119 of German Application No. 10 2013 204 443.7, filed Mar. 14, 2013. International application of PCT/EP2014/054047 also claims priority under 35 USC 119(e) to U.S. Provisional Application No. 61/781,759, filed Mar. 14, 2013. The contents of international application of PCT/EP2014/054047 and German patent application DE 10 2013 204 443.7 are incorporated herein by reference.

The invention relates to an optical assembly for simultaneously increasing the etendue of the used emission of a light source having an etendue of less than 0.1 mm$^2$. Furthermore, the invention relates to an illumination optical unit comprising such an optical assembly, an optical system comprising such an illumination optical unit, an illumination system comprising such an illumination optical unit, and a projection exposure apparatus comprising such an optical system.

Components for EUV projection lithography are known from US 2003/0002022 A1, DE 10 2009 025 655 A1, U.S. Pat. No. 6,700,952 and US 2004/0140440 A.

It is an object of the present invention to provide an optical assembly for simultaneously increasing the etendue of the used emission of a light source having an etendue of less than 0.1 mm$^2$.

This object is achieved according to the invention via an optical system comprising: a light source having an original etendue of less than 0.1 mm$^2$ for an illumination system for projection lithography; and an optical assembly for simultaneously increasing the etendue of a used emission of the light source. The optical assembly is embodied such that a simultaneous increase in the etendue by at least a factor of 10 results. The optical system is embodied such that a component of the optical assembly that is impinged on is displaced relative to the light source such that an impingement region of the emission of the light source on the optical component of the optical assembly varies temporally.

The etendue is the smallest volume of a phase space containing 90% of the light energy of an emission of a light source. Definitions of the etendue that correspond to this can be found in EP 1 072 957 A2 and U.S. Pat. No. 6,198,793 B1, which indicate that the etendue is obtained by multiplying the illumination data x, y and NA$^2$, wherein x and y are the field dimensions spanning an illuminated illumination field, and NA is the numerical aperture of the field illumination. In the case of the simultaneous increase in the etendue, this increase being brought about by the optical assembly, the increase in the etendue is carried out simultaneously, that is to say at a given point in time, for the entire used emission impinging on the optical assembly. A sequential increase in the etendue, for example by the use of a deflection scanning mirror, does not constitute a simultaneous increase in the etendue. In the case of the sequential increase in the etendue, at a given point in time the used emission is present with non-increased etendue, wherein the increase in the etendue arises exclusively on account of the deflecting effect of the deflection scanning mirror over the course of time. The illumination system, for which the optical assembly is intended to be suitable, for projection lithography is a light source and a downstream illumination optical unit for illuminating an illumination field. Problems which occur on account of an illumination pupil being filled only in a punctiform manner by the light source having the low original etendue, which is also designated as the initial etendue, are reduced or even completely eliminated by the use of the optical assembly according to the invention. The light source having the very low etendue can be a synchrotron radiation source or a radiation source on the basis of a free electron laser (FEL). Etendues of the light source of even less than 0.1 mm$^2$ are also possible, for example an etendue of less than 0.01 mm$^2$, wherein corresponding advantages then arise on account of the etendue-increasing effect of the optical assembly. The optical assembly can be disposed directly downstream of the light source. The optical assembly can therefore comprise the first component which influences the emission of the light source after the emission has emerged from the light source. The optical assembly can be part of an illumination optical unit for illuminating an object field in which, in turn, an object to be imaged can be arranged. Alternatively, the optical assembly can also be situated upstream of such an illumination optical unit. In this last case, the optical assembly can be designed such that it is adapted to the requirements imposed on the used emission of the light source by the downstream illumination optical unit, that is to say in particular to provide an etendue which corresponds to the etendue required by the downstream illumination optical unit. The temporal variation of the impingement region can in particular be such that, on account of the relative displacement of the optical component with respect to the light source of a light source embodied in particular in a pulsed fashion, a displacement distance of the optical component relative to the light source in the time period between two light pulses is at least as large as the impingement region. Impingement-driven wear of the optical component can thereby be reduced or avoided. The relative displacement of the at least one component that is impinged on with respect to the light source can be carried out along exactly one dimension, but can also be carried out along a plurality of dimensions. A relative displacement for example along a path extending over at least two dimensions can be carried out with a constant path velocity. One possible movement pattern for such a relative displacement path may be provided by Lissajous' figures with frequency ratios adapted to the optical requirements. At the impingement location of the optical assembly, the emission of the light source can have a divergence in the range of between 10 μrad and 500 μrad, in particular between 10 μrad and 100 μrad. In the impingement region of the optical assembly, a beam diameter of the emission of the light source, the beam diameter representing a measure of the extent of the impingement region, is in the range of between 0.1 and 5 mm, in particular in the range of between 0.01 and 1 mm. The light source can be operated with a pulse frequency in the range of between 10 MHz and 100 MHz. Even higher pulse frequencies in the range of up to a few GHz are possible. The light source can be operated such that the energy of an individual light pulse remains constant and a required averaged impingement power or impingement energy is set by the pulse frequency being varied.

The optical assembly can increase the etendue by introducing a medium having a scattering function. Such a medium having a scattering function has been found to be particular suitable for increasing the etendue. The medium can be, for example, scattering particles or scattering structures on a substrate. Such scattering structures can be produced for example by an etching method for roughening a substrate surface. A computer generated hologram (CGH)

can also be used as scattering structures. Such a CGH is designed in such a way that the used emission of the light source is diffracted by targeted structuring of the surface of the component of the optical assembly that is impinged on, with the result that an intensity profile of the used emission that has been expanded in a desired manner is available in the far field of the used emission. Such CGH structures can be configured in an irregular fashion. Such CGH structures can produce the desired intensity profile of the used emission in the far field by superimposition of different diffraction patterns.

The optical assembly can have a scattering particle generator, which generates scattering particles, wherein the scattering particles interact with the emission of the light source in order to increase the etendue. Such a scattering particle generator leads to an advantageously large increase in the etendue on account of the scattering effect of the scattering particles. In this case, the scattering particles are the components impinged on by the emission of the light source. An impingement region is predefined by a scattering particle portion that is impinged on or by the scattering particle that is impinged on overall. The scattering particles can be scattering droplets. Alternatively, gas molecules or a gas can serve as scattering particles. In principle, solid scattering particles are also possible. The scattering particles can be composed of a material having a refractive index n for which the following holds true: $n \neq 1$. The refractive index n can be greater than 1 ($n>1$) and can be very significantly greater than 1 ($n \gg 1$). A trajectory of the scattering particles can be perpendicular to an emission direction of the light source. This provides for readily controllable interaction conditions between the scattering particles and the emission of the light source. If the light source is operated in a pulsed fashion, the scattering particle generator can operate in a manner synchronized with the light source. A temporal variation of the impingement region arises as a result of the relative movement of the scattering particles relative to the light source or as a result of a sequential impingement on different scattering particles.

An embodiment of the scattering particle generator can have a raw particle generation device and a scattering particle dispersing device, which is embodied such that raw particles initially generated in the raw particle generation device are dispersed to form the scattering particles via the scattering particle dispersing device. Such a scattering particle generator reduces the requirements made of the raw particle generation. The scattering particle dispersing device can be embodied as a laser, in particular as an Nd:YAG laser. The scattering particles formed by the scattering particle dispersing device can be present in the form of a plasma. If a laser is used as the scattering particle dispersing device, its laser radiation can be radiated in the opposite direction to the trajectory of the raw particles. The raw particle generation device and the scattering particle dispersing device can operate in a synchronized manner such that a dispersing interaction is optimized. This synchronization can be coordinated with a synchronization of the scattering particle generator with the light source in the case of pulsed operation of the light source.

The optical system can include a collecting device for the generated scattering particles in their trajectory after their interaction with the emission of the light source. Such a collecting device provides for controlled disposal of the generated scattering particles after their interaction for increasing the etendue. The collecting device can be part of a circulation system for the scattering particle material. The collecting device can have a unit for generating an electromagnetic deflection field.

The optical system can include an optical component for influencing the emission of the light source in an etendue-increased manner, wherein the optical component bears etendue-increasing structures, wherein the optical component cooperates with a drive device for the displacement of the optical component and thus for the temporal variation of the impingement region. Such a structure-bearing optical component as part of the etendue-increasing optical assembly is comparatively simple in terms of construction and in operation. The etendue-increasing structures can have a typical dimension which is in the range of a wavelength of the used emission of the light source or is smaller than the wavelength. The optical component bearing the etendue-increasing structures can be a first optical component, in particular a first deflection mirror, in the emission beam path downstream of the light source. The etendue-increasing structures can be produced during the operation of the light source by the interaction thereof with the etendue-increasing optical component. The drive device prevents the emission of the light source from always impinging on the same impingement region of the optical component, that is to say provides for the temporal variation of the impingement region. A thermal loading of the optical component is thus reduced. Moreover, this results in a desired averaging over the etendue-increasing effect on account of the scattering at the structures of the optical component. The displacement by the drive device can be a periodic displacement. Degrees of freedom of the displacement can be present in the form of a translation, in the form of a rotation or else in the form of a vibration.

A corresponding drive device for reducing a point or area loading of an impingement on the optical component by the emission of the light source, in particular by an EUV emission, can be used even if the optical component does not contain an etendue-increasing structure.

The drive device can bring about a periodic and/or aperiodic displacement of the component. Such a periodic or aperiodic displacement can be brought about for example by the targeted use of an unbalance of the optical component and/or the drive device, if appropriate in conjunction with a suitable mounting. The unbalance can bring about a periodic displacement. The mounting can bring about an aperiodic displacement.

A driven displacement can be performed by the drive device such that a main deflection direction of the optical component does not change. Such an embodiment simplifies beam guiding downstream of the etendue-increasing optical component. As an alternative to this embodiment, in which the main deflection direction does not change, the optical component can additionally perform a scanning operation, that is to say also bring about a sequential increase in the etendue.

The optical component can be embodied as a deflection mirror. Such a configuration can additionally be used for beam guiding. The etendue-increasing optical component can be embodied as an NI mirror or as a GI mirror. An NI (normal incidence) mirror is a mirror having an angle of incidence that is less than 45°, in particular is less than 35° and can also be even less, for example can be less than 20°, than 15° or than 10°. A GI (grazing incidence) mirror is a mirror for grazing incidence having an angle of incidence of greater than 60°. In the case of a GI mirror or in the case of an NI mirror having an angle of incidence near to normal incidence, polarization influencing of the used emission can be practically disregarded. Moreover, a GI mirror experiences a lower thermal loading when impinged on by a used emission. The etendue-increasing optical component can alternately be a transmission component.

The optical system can include an illumination optical unit comprising and an optical assembly for illuminating an object field in which an object that can be imaged via a projection exposure apparatus can be arranged. The advantages of such an optical system correspond to those which have already been discussed above in connection with the etendue-increasing optical assembly. The optical assembly can be part of the illumination optical unit or can alternatively also be configured as a component separate from the illumination optical unit. In the latter case, the optical assembly can be configured, and in particular retrofitted, for an already existing illumination optical unit.

The optical system can have intermediate focus of a beam guiding of the used emission of the light source after an interaction with the optical assembly. Such an intermediate focus facilitates suppression of undesired secondary emissions, in particular from foreign particles, of the light source and/or of the scattering particle generator in the beam path of the used emission. A collector can be arranged between an interaction volume, within which the scattering particles interact with the light source emission, and the intermediate focus. The collector can be a GI collector, that is to say for example a collector having mirrors for grazing incidence, and in particular a Wolter collector. The intermediate focus can be spaced apart from an optical axis predefined by an emission of the light source that is not deflected after the interaction with the optical assembly. Such spacing-apart of the intermediate focus from the optical axis of a non-deflected emission of the light source has proved to be particularly suitable for improving a separation of the used emission from unusable emission portions of the light source. The distance between the intermediate focus and the optical axis of an emission of the light source that is not deflected downstream of the interaction volume can be greater than 5 cm and can be greater than 10 cm. A ray trap can be provided for the unused emission.

An optical system can include a projection optical unit for imaging the object field into an image field in which a wafer can be arranged. An optical system can include a free electron laser (FEL) as the light source. A projection exposure apparatus can include an optical system described above. The advantages of such an optical system and of such a projection exposure apparatus correspond to those which have already been explained above with reference to the optical assembly and the illumination optical unit. The light source can be an EUV light source having a used wavelength range of between 5 nm and 30 nm. The projection exposure apparatus can be used in particular for producing a micro- and/or nanostructured component, in particular a semiconductor chip.

Exemplary embodiments of the invention are explained in greater detail below with reference to the drawing, in which:

FIG. 1 schematically shows main components of a projection exposure apparatus for EUV projection lithography;

Figure 1:
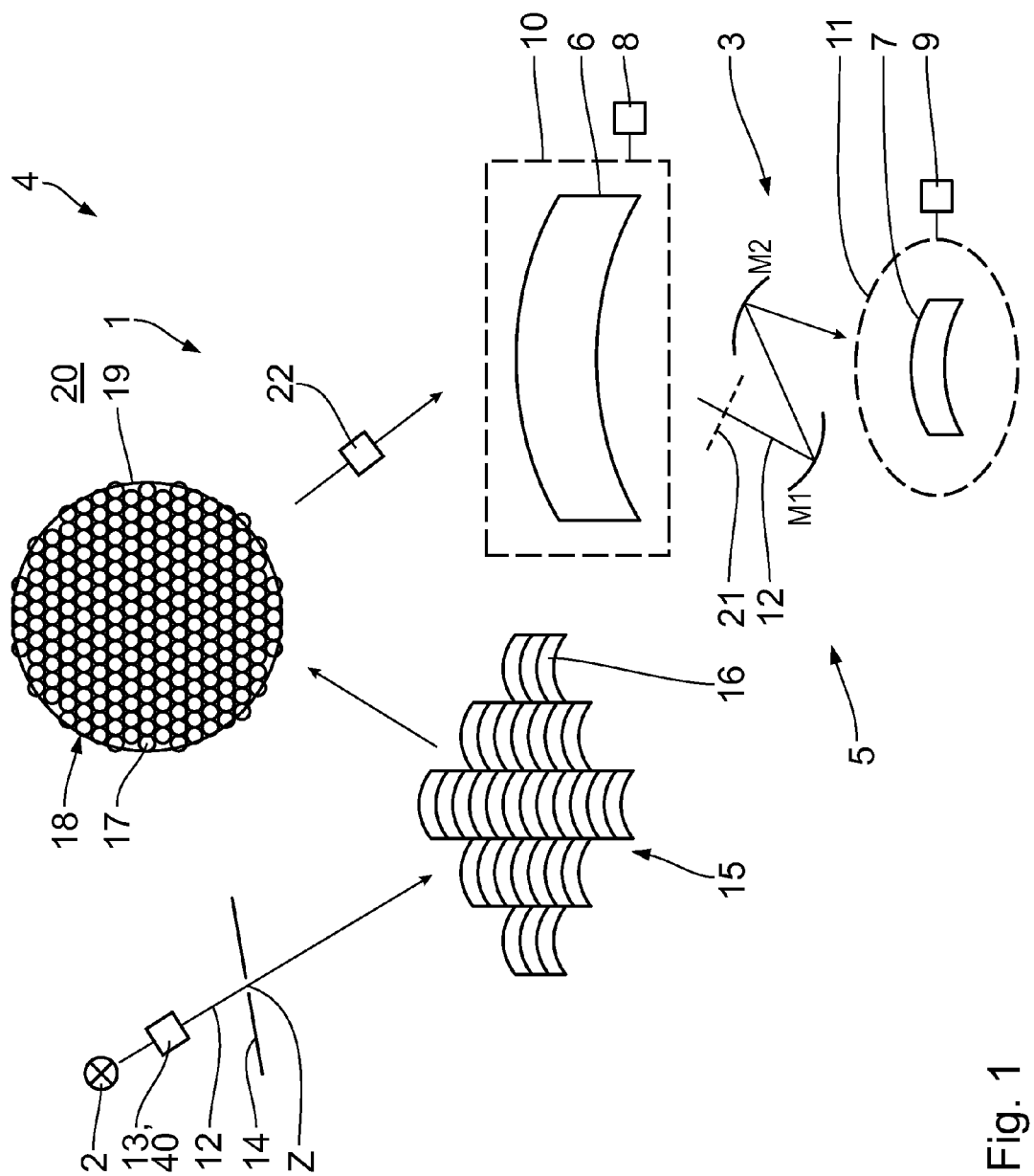

FIG. 1 schematically shows an illumination optical unit 1, a light source 2, and an imaging optical unit or projection optical unit 3 of a projection exposure apparatus 4 for EUV microlithography. An illumination system 5 of the projection exposure apparatus 4 has, besides the illumination optical unit 1 serving for illuminating an object field 6 of the projection exposure apparatus, the projection optical unit 3 for imaging the object field 6, lying in an object plane, into an image field 7 in an image plane. Besides the illumination system 5 and the EUV light source 2, the projection exposure apparatus 4 also has, in particular, a plurality of mechanical components, holders 8, 9 for a reticle 10 arranged in the object plane, the reticle being illustrated by dashed lines in FIG. 1, and for a wafer 11 arranged in the image plane, the wafer being illustrated by dashed lines in FIG. 1. A structure on the reticle 10 is imaged onto a light-sensitive layer of the wafer 11 arranged in the region of the image field 7 in the image plane.

The imaging optical unit 3 is embodied as a catoptric optical unit having a plurality of mirrors, of which two mirrors M1, M2 are illustrated schematically in FIG. 1. The imaging optical unit 3 generally has a larger number of mirrors, for example four, six or eight mirrors.

The light or radiation source 2 is an EUV (Extreme Ultraviolet) light source having an emitted used radiation in the range of between 5 nm and 30 nm. The light source 2 is a coherent light source. A wavelength band used for the EUV projection exposure or a target wavelength range of the EUV radiation 8 is 13.5 nm±1 nm, for example, but can also be in the range of between 5 nm and 8 nm, for example. The EUV radiation 12 is also designated hereinafter as illumination and imaging light or as used emission. A different target wavelength range, for example between 5 nm and 17 nm, is also possible. A bandwidth of the EUV wavelength band used can be greater than 0.1 nm and can be, in particular, between 0.1 nm and 2 nm. A typical bandwidth of the EUV radiation 12 used is 1% of the center wavelength. The light source 2 is a synchrotron source or a source on the basis of a free electron laser (FEL). The light source 2 has an etendue that is less than $10^{-7}$ $m^2$ $rad^2$ or 0.1 $mm^2$. The etendue is the smallest volume of the phase space containing 90% of the light energy. A wavelength bandwidth of the light source 2 can be very much greater than the bandwidth of the EUV wavelength band used and can be 0.1 µm, for example.

An optical assembly 13 for simultaneously increasing the etendue of the used emission 12 of the light source 2 is disposed downstream of the light source 2 in the beam path of the used emission 12. The optical assembly 13 is merely indicated schematically in FIG. 1. Embodiments of the optical assembly 13 will also be explained below with reference to FIG. 2 et seq. A deflection mirror for the used emission 12 can be disposed downstream of the optical assembly 13, as will likewise be explained below.

The generated EUV radiation 12 having the increased etendue propagates through an intermediate focus plane 14 before it is incident on a field facet mirror 15 having field facets 16 that are impinged on by the illumination light 12. The field facets 16 are arcuate, but can also be configured in a rectangular fashion. A different shape of the field facets 16 is also possible.

In the intermediate focus plane 14, the EUV radiation has an intermediate focus Z, that is to say a location of smallest transverse extent.

The EUV radiation 12 reflected by the field facet mirror 15 is constructed from a multiplicity of illumination channels, that is to say partial beams of radiation, wherein each partial beam is reflected by a specific field facet 16. Each partial beam is incident in turn on a pupil facet 17 of a pupil facet mirror 18 that is assigned to the partial beam via the illumination channel.

The pupil facets 17 are arranged on a common carrier plate 19 of the pupil facet mirror 18. The pupil facet mirror is arranged in an illumination pupil plane 20. The pupil facets 17 are embodied in a round fashion. Alternatively, a hexagonal or rectangular embodiment of the pupil facets 17 is also possible. The pupil facets 17 are arranged in a closely packed fashion. Via the field facet mirror 15, at the location of the pupil facets 17 of the pupil facet mirror 18, secondary light sources are generated as images of the intermediate focus Z in the intermediate focus plane 14. The pupil facet mirror 18 is arranged in a plane of the illumination optical unit 1 which coincides with a pupil plane 21 of the projection optical unit 3 or is optically conjugate with respect thereto. An intensity distribution of the EUV radiation 12 on the pupil facet mirror 17 is therefore directly correlated with an illumination angle distribution of an illumination of the object field 6 in the object plane and an illumination of the image field 7 in the image plane.

With the aid of the pupil facet mirror 18 and an imaging optical assembly in the form of a schematically indicated transfer optical unit 22, the field facets 16 of the field facet mirror 15 are imaged into the object field 6. Embodiments of the projection exposure apparatus 4 in which the illumination pupil plane 20 coincides with the projection optical unit pupil plane 21 are also possible. In such a case, the transfer optical unit 22 can also be dispensed with.

As an alternative to the arrangement of field facets/field pupil facets as explained above, the etendue-increasing optical assembly 13 can also be combined with a different illumination concept, in particular for projection exposure. One example of such a further illumination concept is a specular reflector, described for example in US 2006/0132747 A1, EP 1 614 008 B1 and U.S. Pat. No. 6,573,978.

Figure 2:
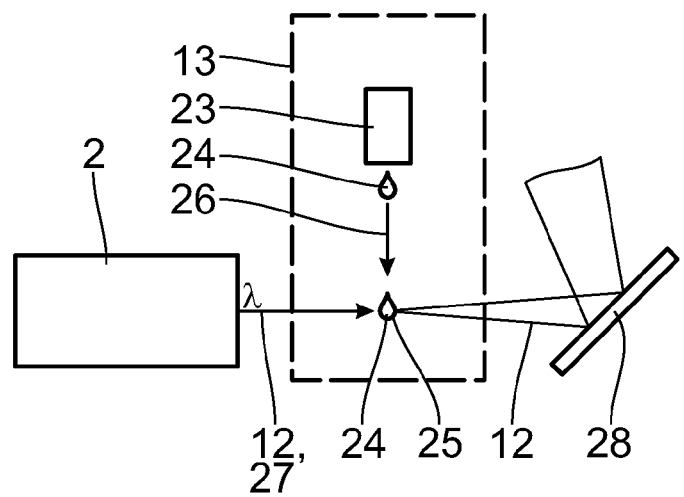
FIG. 2 shows an embodiment of an optical assembly for simultaneously increasing the etendue of the used emission of a light source of the projection exposure apparatus, containing a scattering particle generator.

FIG. 2 shows an embodiment of the optical assembly 13 for simultaneously increasing the etendue of the used emission 12 of the light source 2. The optical assembly 13 leads to the etendue being increased by at least a factor of 10. A simultaneous increase in the etendue in this case denotes an increase in the etendue which the used emission 12 itself actually has at a given point in time. A sequential increase in the etendue, which can be generated for example via a scanning mirror via which the used emission 12 is deflected, is not a simultaneous increase in the etendue.

The optical assembly 13 has a scattering particle generator 23 for generating scattering particles 24. The scattering particles 24 interact in an interaction volume 25 with the emission of the light source 2 in order to increase the etendue of the used emission 12. In this case, an impingement region on the scattering particles 24 is impinged on by the emission of the light source 2. On account of the movement of the scattering particles 24 and in particular on account of sequential impingement on different scattering particles 24, a corresponding temporal variation of the impingement region of the emission of the light source on the scattering particles 24 is effected. Particularly in the case of a pulsed embodiment of the light source 2, the scattering particle generator 23 can be operated in a manner synchronized with respect to the light source 2 such that each light pulse of the emission of the light source 2 interacts with in each case a fresh scattering particle 24 not yet impinged on previously, such that a corresponding temporal variation of the impingement region of the optical assembly 13 likewise results.

In the case of the embodiment according to FIG. 2, the scattering particles 24 are scattering droplets. Alternatively, the scattering particles can be gas molecules or a plasma. The scattering particles 24 are composed of a material having a refractive index n that deviates from the value 1. A trajectory 26 of the scattering particles 24 from the scattering particle generator 23 toward the interaction volume 25 can be perpendicular to an emission direction 27 of the light source 2.

The scattering particles 24 can be metal particles, in particular metal droplets. Material examples are copper (Cu), nickel (Ni), tin (Sn), molybdenum (Mo), silicon (Si) or ruthenium (Ru) or mixtures or alloys of these metals.

As a result of scattering at the scattering particles 24, the etendue of the used emission 12 increases by at least a factor of 10. The increase in the etendue can be significantly greater, for example by at least a factor of 25, by at least a factor of 50, by at least a factor of 100, by at least a factor of 250, by at least a factor of 500, by at least a factor of 1000, or else by further orders of magnitude.

In the case of the embodiment according to FIG. 2, the etendue-increased used emission 12 is completely deflected by a deflection mirror 28. The used emission 12 is then transferred into the intermediate focus Z, this not being illustrated in FIG. 2.

Figure 3:
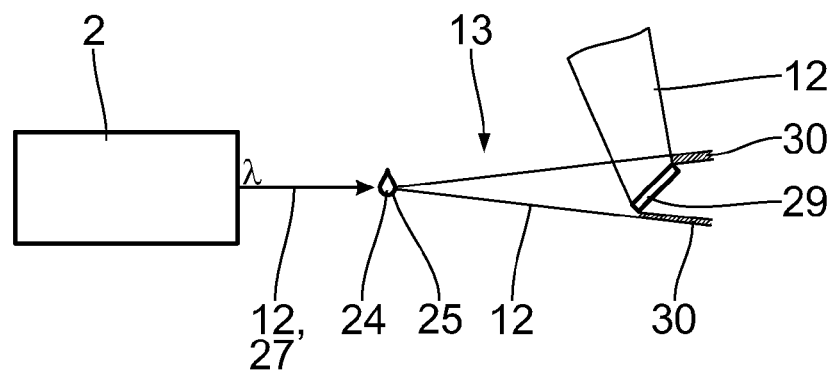
FIGS. 3 and 4 show variants of an embodiment of the etendue-increasing assembly according to FIG. 2.

FIG. 3 shows a variant of the optical assembly 13, the scattering particle generator 23 being omitted there. Components which, in the figures described below, correspond to those which have already been explained with regard to the figures already discussed bear the same reference numerals and will not be described in detail again.

In the case of the embodiment according to FIG. 3, a selective deflection mirror 29 is part of the optical assembly 13 for increasing the etendue. The selective deflection mirror 29 is arranged in the beam path of the used emission 12 downstream of the interaction volume 25. A central divergence portion of the used emission 12 is deflected. That is to say that from the divergence produced overall on account of the increase in the etendue, a central part of a beam of rays of the used emission 12 is deflected and thus selected by the selective deflection mirror 29. This central divergence portion, which then constitutes the actual used emission 12, is then transferred into the intermediate focus Z. Beam portions 30 not deflected by the selective deflection mirror 29 are disposed of in a controlled manner, for example blocked or fed to some other use, for example to a light source monitoring device (not explained in more specific detail).

Figure 4:
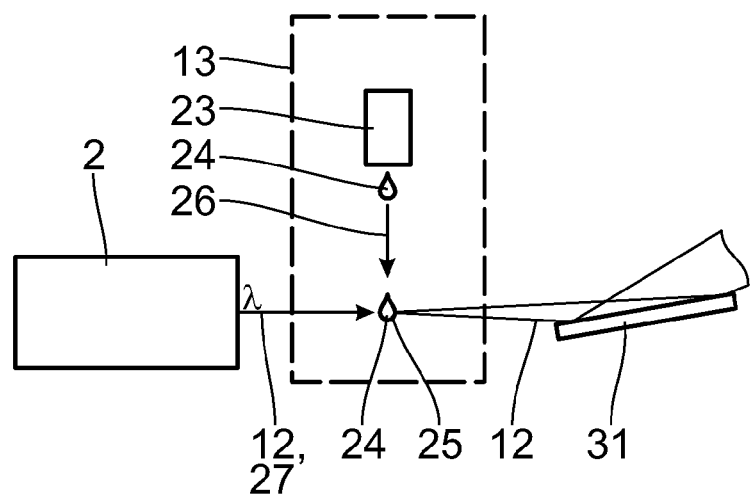

FIG. 4 shows a variant of beam guiding of the used emission 12 which can be used as an alternative to the embodiment according to FIG. 2. In contrast to the deflection mirror 28 according to FIG. 2, which is embodied as a normal incidence mirror (NI mirror) and carries out a deflection with an angle of incidence in the region of 35°, in the case of the embodiment according to FIG. 4 a deflection mirror 31 for grazing incidence (grazing incidence mirror, GI mirror) with an angle of incidence of greater than 60° is disposed downstream of the interaction volume 25. The used emission 12 deflected by the GI mirror 31 is subsequently transferred into the intermediate focus Z. A substantially polarization-maintaining deflection of the used emission 12 is possible with the aid of a GI mirror.

Figure 5:
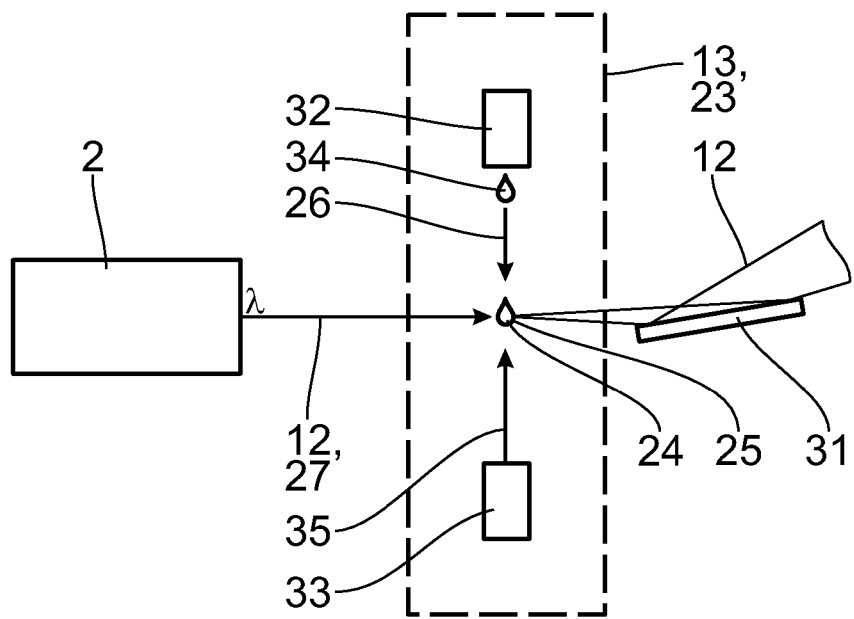
FIG. 5 shows a further variant of the etendue-increasing assembly comprising a scattering particle generator, having a raw particle generation device and a scattering particle dispersing device.

FIG. 5 shows a further variant of the etendue-increasing assembly 13. Components corresponding to those which have already been explained above with reference to FIG. 4 bear the same reference numerals and will not be discussed in detail again.

In the case of the embodiment according to FIG. 5, the scattering particle generator 23 has a scattering particle dispersing device 33 besides a raw particle generation device 32.

The scattering particle dispersing device 33 is embodied such that raw particles 34 initially generated in the raw particle generation device 32 are dispersed to form the scattering particles 24. In the case of the embodiment according to FIG. 5, the scattering particle dispersing device 33 is a laser, in particular an Nd:YAG laser. The raw particles 34 can be present in the form of liquid droplets. Under the action of the scattering particle dispersing device 33, the raw particles 34 can be dispersed into a multiplicity of smaller scattering particles 24, which can be done by evaporation or else by plasma generation. An interaction volume in which the scattering particle dispersing device 33 converts the raw particles 32 into the scattering particles 24 can lie in the trajectory 26 of the raw particles 34 upstream of the interaction volume 25. Alternatively, the interaction volume of the dispersing device 33 can coincide with the interaction volume 25 in which the scattering particles interact with the EUV radiation 12. The laser can be caused to emit radiation in the opposite direction to the trajectory 26 of the raw particles 34 (cf. direction arrow 35 in FIG. 5).

Figure 6:
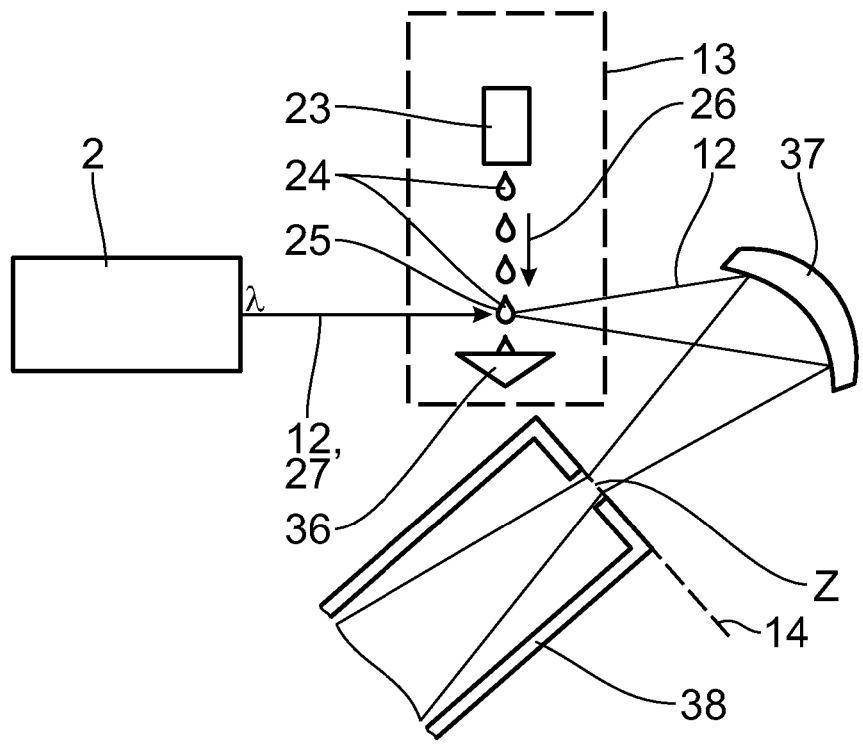
FIG. 6 shows a further variant of the etendue-increasing assembly comprising a scattering particle generator, a collecting device for generated scattering particles and a downstream collector for generating an intermediate focus of the used emission.

FIG. 6 shows a further variant of an etendue-increasing assembly 13. Components which have already been explained with reference to FIGS. 1 to 5, and in particular with reference to FIG. 2, bear the same reference numerals and will not be discussed in detail again.

The etendue-increasing assembly 13 according to FIG. 6 has a collecting device 36 for the generated scattering particles 24 in their trajectory 26 downstream of the interaction volume 25. The collecting device 36 can be embodied as a collecting basin. The collecting device 36 can be fluid-connected to the scattering particle generator 23 via a circulation (not illustrated), such that the scattering particle material can be reused after a first interaction in the interaction volume 25. The collecting device 36 can have a unit for generating an electromagnetic deflection field for deflecting charged scattering particles 24.

In the case of the embodiment according to FIG. 6, a collector mirror 37 is arranged between the interaction volume 25 and the intermediate focus Z in the intermediate focus plane 14. The collector mirror images the interaction volume 25 into the intermediate focus Z. A beam path of the used emission 12 downstream of the intermediate focus Z lies in a vacuum chamber 38. In the region of the intermediate focus Z, a passage opening or a passage window can be present in the vacuum chamber 38.

In the case of the embodiment according to FIG. 6, the collector 37 is embodied as a collector having an angle of incidence of less than 60°, and in particular less than 45°, that is to say is embodied as a collector for substantially normal incidence (normal incidence collector, NI collector).

Figure 7:
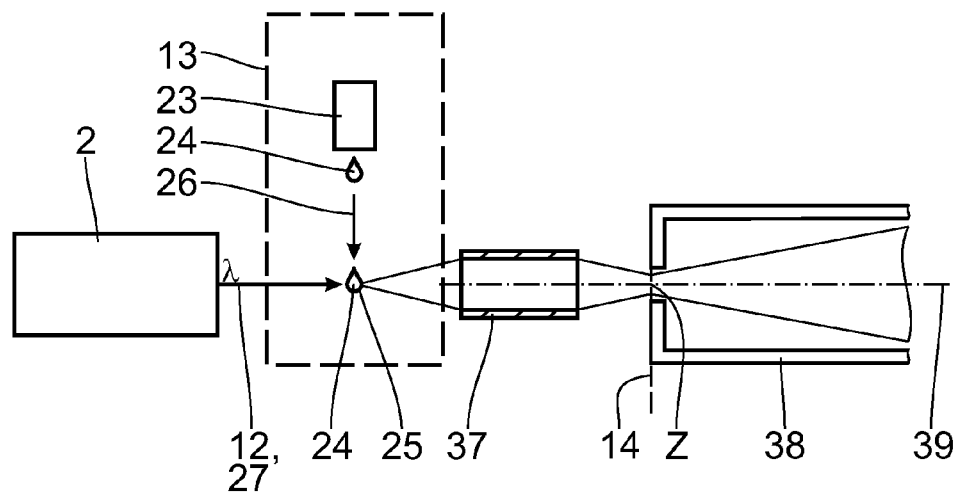
FIGS. 7 and 8 show further variants of an etendue-increasing assembly comprising a collector for generating an intermediate focus.
Figure 8:
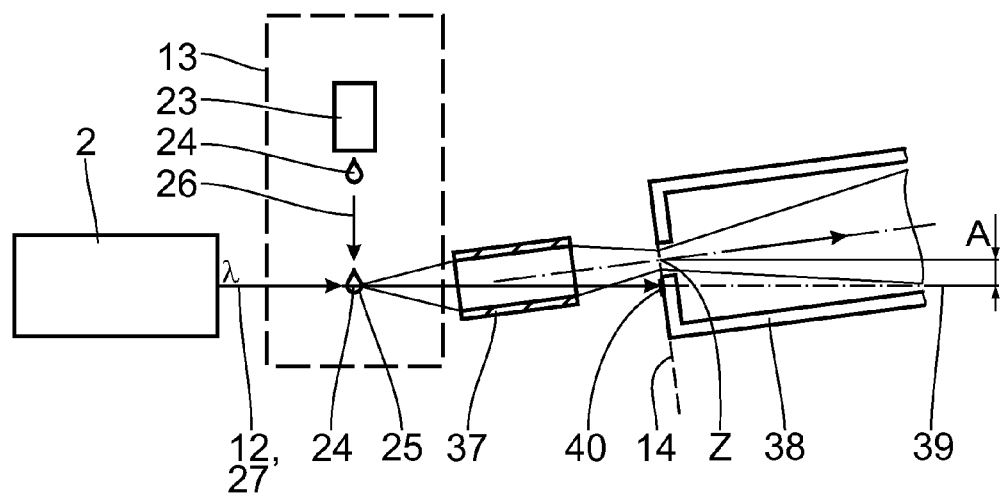

FIGS. 7 and 8 show further embodiments of the etendue-increasing assembly 13 with variants of the collector 37. The latter is embodied as a Wolter collector in the case of the embodiments according to FIGS. 7 and 8. Examples of Wolter collectors can be found on the Internet pages www.x-ray-optics.de and the references indicated there.

In the case of the beam guiding according to FIG. 7, the intermediate focus Z lies on an optical axis 39 of an emission of the light source 2 that is not deflected downstream of the interaction volume 25.

In the case of the embodiment according to FIG. 8, there is a distance A between the intermediate focus Z and the optical axis 39 of the emission of the light source 2 that is not deflected downstream of the interaction volume 25. In the case of the embodiment according to FIG. 8, therefore, it is possible, for example, to embody a wall of the vacuum chamber 38 as a ray trap 40 for the non-deflected emission of the light source 2.

With reference to FIGS. 9 to 14, a description is given below of further variants of an etendue-increasing assembly 40, which can be used instead of the embodiments of the etendue-increasing assembly 15. Components corresponding to those which have already been explained above with reference to FIGS. 1 to 8 bear the same reference numerals and will not be discussed in detail again.

Figure 9:
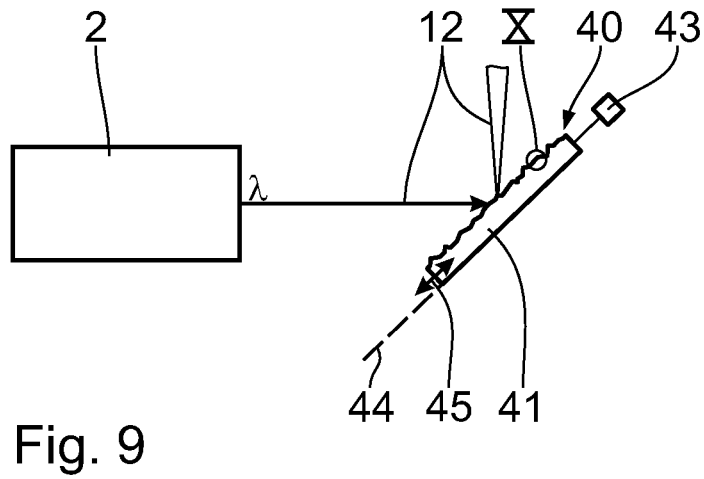
FIG. 9 shows a further embodiment of an optical assembly for simultaneously increasing the etendue of the used emission of the light source of the projection exposure apparatus according to FIG. 1 comprising a driven optical component bearing etendue-increasing structures.
Figure 10:
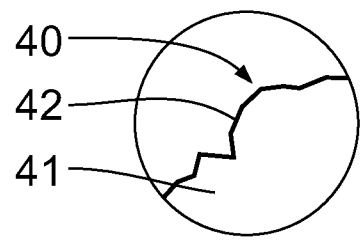
FIG. 10 shows an enlargement of an excerpt from FIG. 9, rotated by 45° in the clockwise direction.

The optical etendue-increasing assembly 40 according to FIG. 9 has an optical component 41—embodied as a deflection mirror—for etendue-increasing influencing, in the embodiment according to FIG. 9 for etendue-increasing deflection, of the EUV radiation 12 of the light source 2. The optical component 41 has etendue-increasing structures 42, which are illustrated schematically in the enlargement of the excerpt according to FIG. 10. The structures 42 have a typical extent which is less than or equal to the wavelength of the used emission 12. This results in a scattering effect of the structures 42 for the used emission 12, which leads to an increase in the divergence and thus to a simultaneous increase in the etendue. The explanations already given above in connection with the etendue-increasing assembly 13 hold true for the order of magnitude of the increase in the etendue.

The structuring by the structures 42 can be configured as periodic or aperiodic surface structuring.

The optical component 41 cooperates with a drive device 43 for displacing the optical component in a principal reflection plane 44 of the optical component 41 (cf. double-headed arrow 45 in FIG. 9). The drive device 43 drives a periodic translational displacement of the optical component 41. The drive device 43 can be a vibration device for generating the displacement 45. The optical component 41 is a first deflection device, namely a first mirror, in the emission beam path downstream of the light source 2. The optical component 41 is driven such that an impingement region of the emission of the light source 2 on the optical component 41 varies temporally on account of the relative displacement of the optical component 41 with respect to the light source 2. In this case, the relative displacement can have a magnitude such that, in the case of a pulsed operation of the light source 2, successive light pulses impinge on mutually different regions on the optical component 41. A displacement velocity then has a magnitude, therefore, such that a displacement distance of the optical component 41 between two light pulses is greater than a diameter of the impingement region.

The optical component 41 deflects the EUV used radiation 12 approximately by 90°, that is to say is impinged on by the EUV emission of the light source 2 with an angle of incidence in the range of 45°. Other angles of incidence for example in the range of between 10° and 70° are also possible.

Figure 11:
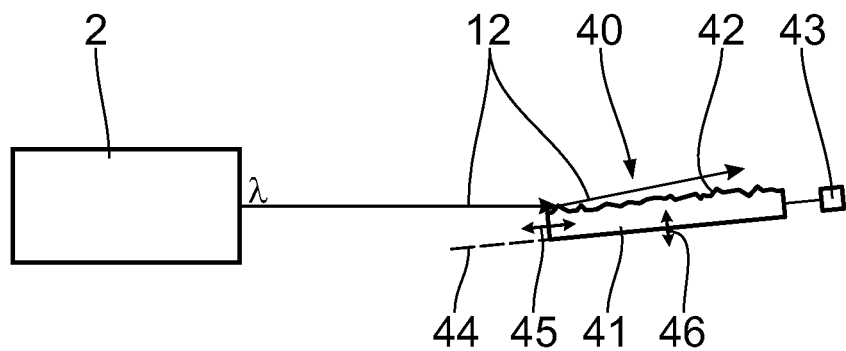
FIGS. 11 and 12 show further variants of a reflective driven optical component having etendue-increasing structures.

FIG. 11 shows a variant with an even greater angle of incidence of the EUV radiation 12 on the optical component 41. In the case of the embodiment according to FIG. 11, the optical component 41 is embodied as a GI mirror having the etendue-increasing scattering structures 42. The drive device 43 can bring about, besides the displacement 45 in the principal reflection plane 44, alternatively or additionally, a displacement 46 perpendicular to the principal reflection plane 44, as illustrated by a double headed arrow 46 in FIG. 11. In addition to the simultaneous increase in the etendue, a sequential increase in the etendue of the used emission 12 can then also be brought about. Besides a pure translational displacement, a pivoting of the optical component 41 by the drive device 43 is also possible.

On account of the displacement 45 and/or 46, an impingement area on the optical component 41 which is impinged on by the used emission 12 of the light source 2 varies. This can be used for reducing a point loading on the optical component 41 as a result of the EUV radiation 12 and/or for averaging an increase in the etendue that is produced by the structures 42 respectively impinged on.

The structures 42 can be configured in the manner known for example from DE 10 2009 047 316 A1.

The displacement 45 and/or the displacement 46 can be embodied as periodic or as aperiodic displacement.

The structures 42 constitute static structures. The structures 42 can influence the direction of the EUV radiation 12 also by reflection and/or by diffraction, as an alternative or in addition to a scattering effect.

Figure 12:
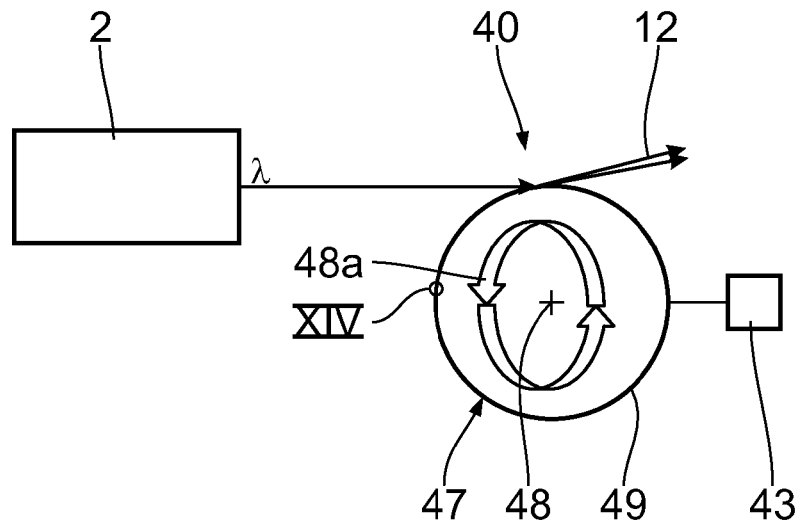
Figure 13:
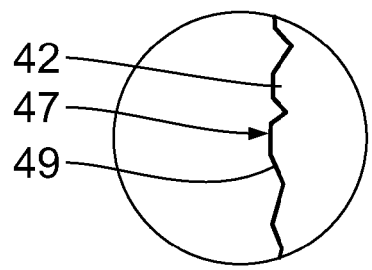
FIG. 13 shows an enlargement of an excerpt according to FIG. 12 in an illustration similar to FIG. 10.

FIGS. 12 and 13 show a further variant of the etendue-increasing assembly 40 comprising a structured, etendue-increasing optical component 47, which can be used instead of the optical component 41 according to FIGS. 9 and 11.

The optical component 47 is embodied as a cylinder having a longitudinal axis 48, which is perpendicular to the plane of the drawing in FIG. 12. The drive device 43 provides for a rotation of the etendue-increasing component 47 about a rotation axis which coincides with the longitudinal axis 48 (cf. direction arrow 48a). The used emission 12 of the light source 2 is reflected at a lateral surface wall 49 of the etendue-increasing component 47. The lateral surface wall 49 once again bears the scattering structures 42, as can be seen schematically in the enlarged illustration according to FIG. 13. A grazing reflection of the used emission 12 takes place at the lateral surface wall 49.

The etendue-increasing component 47 can be embodied as a hollow cylinder or as a solid cylinder.

The displacements 45 in the case of the embodiment according to FIGS. 11 and 48a in the case of the embodiment according to FIG. 12 are in each case such that a main deflection direction of the optical components 41 and 47, respectively, does not change.

In addition to a simultaneous increase in the etendue that is produced via the structures on account of the scattering, in the case of the etendue-increasing component 47, a sequential increase in the etendue can be produced by the lateral surface wall 49 additionally being subjected to vibration. Such subjection to vibration can be produced by bringing about or tolerating a targeted unbalance of the etendue-increasing component 47.

Figure 14:
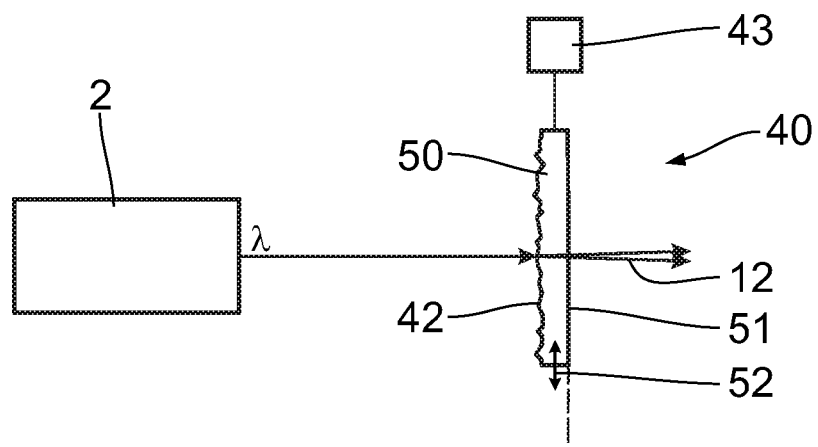
FIG. 14 shows an embodiment of a transmissive driven optical component having etendue-increasing structures.

FIG. 14 shows a further embodiment of the optical etendue-increasing assembly 40. The latter has an optical component 50 embodied as a component that is transmissive to the used emission 12. An entrance surface of the etendue-increasing component 50 once again bears the scattering structures 42 for increasing the etendue. Alternatively or additionally, an exit surface 51 can bear such structures 42, this not being illustrated in FIG. 14.

A displacement 52 of the transmissive etendue-increasing component 50 parallel to the entrance and/or exit surface is effected via the drive device 43. The used emission 12 increased in terms of its etendue by the transmissive etendue-increasing component 50 is transferred into the intermediate focus Z after passing through the component 50.

The components embodied as mirrors in the optical assemblies 13 and 40, respectively, like the other EUV mirrors of the optical units 1, 3 as well, can also be provided with a multilayer coating that increases the reflectivity, as is known in principle from the prior art.

The optical assemblies 13 and 40, respectively, explained above can also be used in combination with one another in order to increase the etendue of the used emission 12. By way of example, a sequential arrangement of embodiments of the optical assemblies 13 and 40, respectively, in the beam path of the used emission is possible.

The structures 42 can also be produced during the operation of the light source 2 via the interaction thereof with the optical component 41, 47 and 50, respectively.

A movement velocity of the displacements 45 and 46 and 48a, respectively, is chosen such that the optical components 41 and 47 and 50, respectively, are not destroyed at points. Alternatively, a certain material removal can be brought about in a targeted manner, such that the EUV radiation 12 incident on the optical component 41; 47; 50 produces the scattering structures 42 during operation.

In order to produce a micro- or nanostructured component, the projection exposure apparatus 4 is used as follows: firstly, the reticle 7 and the wafer are provided. A structure on the reticle 10 is then projected onto a light-sensitive layer of the wafer 11 with the aid of the projection exposure apparatus 4. As a result of the development of the light-sensitive layer, a microstructure is then produced on the wafer 11 and the micro- or nanostructured component is thus produced.

In the exemplary embodiments explained above there is in each case a center-of-gravity movement of the impingement region of the respective optical component of the optical assemblies 13 and 40, respectively, the impingement region being impinged on by the emission of the light source 2. In other words, for example, the entire scattering particles 24 and thus also the center of gravity thereof move. The optical components 41, 47 and 50 displaced overall also carry out a center-of-gravity movement.

The invention claimed is:

1. An optical system, comprising:
   a light source configured to emit light having an original etendue of less than 0.1 mm$^2$; and
   an optical assembly, comprising:
     an optical component; and a medium, wherein the optical assembly is configured so that, during use of the optical system:
- the medium scatters light emitted by the light source to simultaneously increase an etendue of the light by at least a factor of 10;
- the light impinges on the optical component; and
- the optical component is displaced so that an impingement region of the light on the optical component of the optical assembly varies temporally.

2. The optical system of claim 1, wherein:
the optical assembly comprises a scattering particle generator configured to generate scattering particles;
the medium comprises the scattering particles; and
the optical assembly is configured so that, during use of the optical system, the scattering particles interact with the emission of the light source to increase the etendue of the used emission of the light source.

3. The optical system of claim 2, wherein:
the scattering particle generator comprises a raw particle generation device and a scattering particle dispersing device; and
the scattering particle generator is configured so that, during use of the optical system, raw particles initially generated in the raw particle generation device are dispersed to form the scattering particles via the scattering particle dispersing device.

4. The optical system of claim 2, further comprising a collecting device configured so that, during use of the optical system, the collecting device collects the scattering particles in their trajectory after their interaction with the emission of the light source.

5. The optical system of claim 1, further comprising a drive device, wherein:
the optical component comprises a body;
the medium comprises etendue-increasing structures at a surface of the body; and
the optical component and the drive device are configured so that, during use of the optical system, the optical component cooperates with the drive device to displace the optical component to temporally vary the impingement region.

6. The optical system of claim 5, wherein the drive device is configured so that, during use of the optical system, the drive device causes a periodic displacement of the optical component and/or aperiodic displacement of the optical component.

7. The optical system of claim 5, wherein the drive device is configured so that, during use of the optical system, the drive device performs a driven displacement so that a main deflection direction of the optical component does not change.

8. The optical system of claim 5, wherein the optical component comprises a deflection mirror.

9. An optical system, comprising:
an optical assembly, comprising:
an optical component; and
a medium,
wherein the optical assembly is configured so that, during use of the optical system:
- the medium scatters light emitted by a light source to simultaneously increase an etendue of the light by at least a factor of 10;
- light impinges on the optical component; and
- the optical component is displaced so that an impingement region of the light on the optical component of the optical assembly varies temporally; and
an illumination optical unit downstream of the optical assembly along a path of light through the optical system, the illumination optical unit configured to illuminate an object field.

10. The optical system of claim 9, wherein the optical system has an intermediate focus downstream of the optical assembly.

11. The optical system of claim 9, further comprising a free electron laser configured to generate the light.

12. The optical system of claim 9, further comprising the light source, wherein the light source is configured to emit light having an original etendue of less than 0.1 $mm^2$.

13. The optical system of claim 12, wherein the light source comprises a free electron laser.

14. The optical system of claim 9, wherein:
the optical assembly comprises a scattering particle generator configured to generate scattering particles;
the medium comprises the scattering particles; and
the optical assembly is configured so that, during use of the optical system, the scattering particles interact with the emission of the light source to increase the etendue of the used emission of the light source.

15. The optical system of claim 9, further comprising a drive device, wherein:
the optical component comprises a body;
the medium comprises etendue-increasing structures at a surface of the body; and
the optical component and the drive device are configured so that, during use of the optical system, the optical component cooperates with the drive device to displace the optical component to temporally vary the impingement region.

16. An apparatus, comprising:
an optical assembly, comprising:
an optical component; and
a medium,
wherein the optical assembly is configured so that, during use of the optical system:
- the medium scatters light emitted by a light source to simultaneously increase an etendue of the light by at least a factor of 10;
- light impinges on the optical component; and
- the optical component is displaced so that an impingement region of the light on the optical component of the optical assembly varies temporally;
an illumination optical unit downstream of the optical assembly along a path of light through the apparatus, the illumination optical unit configured to illuminate an object field; and
a projection optical unit configured to image an object in the object field into an image field, wherein the apparatus is a lithography projection exposure apparatus.

17. The apparatus of claim 16, further comprising the light source, wherein the light source is configured to emit light having an original etendue of less than 0.1 $mm^2$.

18. The apparatus of claim 17, wherein the light source comprises a free electron laser.

19. The apparatus of claim 16, wherein:
the optical assembly comprises a scattering particle generator configured to generate scattering particles;
the medium comprises the scattering particles; and
the optical assembly is configured so that, during use of the optical system, the scattering particles interact with the emission of the light source to increase the etendue of the used emission of the light source.

20. The apparatus of claim 16, further comprising a drive device, wherein:

the optical component comprises a body;
the medium comprises etendue-increasing structures at a surface of the body; and
the optical component and the drive device are configured so that, during use of the optical system, the optical component cooperates with the drive device to displace the optical component to temporally vary the impingement region.

* * * * *